United States Patent

Jabs

[11] Patent Number: 6,118,332
[45] Date of Patent: Sep. 12, 2000

[54] CIRCUIT ARRANGEMENT FOR AN ADJUSTABLE HIGH-PASS FILTER

[75] Inventor: Hermann Jabs, Hamburg, Germany

[73] Assignee: U.S. Philips Corporation, New York, N.Y.

[21] Appl. No.: 09/231,065

[22] Filed: Jan. 14, 1999

[30] Foreign Application Priority Data

Jan. 21, 1998 [DE] Germany .......................... 198 02 037

[51] Int. Cl.$^7$ ...................................................... H03K 5/00
[52] U.S. Cl. .......................... 327/553; 327/552; 327/559; 330/305
[58] Field of Search ..................................... 327/552, 553, 327/559, 560, 530; 330/305; 333/172

[56] References Cited

U.S. PATENT DOCUMENTS

| | | | |
|---|---|---|---|
| 4,509,021 | 4/1985 | van Uden | 330/282 |
| 5,724,006 | 3/1998 | Killian et al. | 330/294 |

FOREIGN PATENT DOCUMENTS

0091160A1 10/1983 European Pat. Off. ......... H03G 3/00

OTHER PUBLICATIONS

V. Riso "Miniturization of Filters" IBM Technical Disclosure Bulletin, vol. 12, No.–5 Oct. 1969, pp. 662–663.

*Primary Examiner*—Dinh T. Le
*Attorney, Agent, or Firm*—Edward W. Goodman

[57] ABSTRACT

In radio receivers, ceramic filters are used for filtering the received frequency band. The limitation of the frequency band in the higher frequency range leads to an asymmetrical crosstalk between the right and left audio channel after decoding in the stereo decoder. These transmission errors are compensated by an adjustable high-pass filter. This high-pass filter precedes the stereo decoder. High-pass filters using potentiometers cannot be integrated. Furthermore, ageing phenomena occur in potentiometers so that the transfer function changes. A high-pass filter with a variable capacitor can neither be integrated easily. Therefore, an arrangement is used in which, after a first amplification of the signal to be filtered, this signal is divided into two signal currents and the amplitude and phase of a sub-current are corrected. This corrected sub-current is added to the main current at a sum node. The sub-current is applied via a voltage divider unit to an amplifier stage having a plurality of inputs. A corresponding input, to which a partial voltage is assigned, is selected via a selection unit. The output of the amplifier stage supplies a changeable voltage which is present at the capacitor. By selecting the partial voltage, the transfer function of the high-pass filter can be adjusted. Transmission errors caused by the low-pass behavior of the ceramic filters are thereby reduced so that the stereo decoder receives a signal which can be accurately separated in the left and the right channel. This circuit arrangement can be integrated in that an adjustable capacitor is realized which consists of a voltage divider, an amplifier stage and the capacitor.

7 Claims, 3 Drawing Sheets

CIRCUIT ARRANGEMENT FOR AN ADJUSTABLE HIGH-PASS FILTER

BACKGROUND OF THE INVENTION

1. Field of the Invention

The invention relates to a circuit arrangement for an adjustable high-pass filter, comprising a main path for conveying a main current, including a first resistor which is connected at the output to a sum node, a sub-path for conveying a sub-current via a voltage divider unit, a first amplifier stage, whose output is coupled to inverting inputs of the first amplifier stage, and a capacitor which is arranged between the output of the first amplifier stage and the sum node, and a second resistor which is connected to the sum node, with the main current and the sub-current being added at the sum node.

2. Description of the Related Art

In conventional systems of radio receivers or car radios, transmission errors for higher frequencies in the audio baseband are caused by the selectivity of the ceramic filters used. After decoding the signal in the stereo decoder, these errors lead to asymmetrical or poor crosstalk between the right and left channel and are compensated by means of an adjustable high-pass filter. The signals to be decoded are filtered in ceramic filters which, in addition to deviations of their characteristic data, also have a low-pass effect, thus causing an increased non-uniform crosstalk of the two channels of a stereo signal.

The magazine "Electronics" Mar. 10, 1981, pp. 191–192 describes a system in which the filter properties are changed by means of changeable parameters. The signal components passed through the filters are admixed to the main component of the signal after they have been influenced in an amplifier stage, and their variations are added. However, the filters comprise components which cannot be integrated because of their size. Moreover, a DC offset on the basic signal is produced at the mixing point so that a distortion factor distorts the desired signal during the addition. Ground is used as a reference potential.

European Patent Specification EP 0 091 160, corresponding to U.S. Pat. No. 4,509,021, describes a system in which the non-inverting input of an amplifier stage is connected to a voltage divider. The partial voltages are applied to the non-inverting input via a switch. The inverting input is also connected via a further switch to a further voltage divider via which the inverting input is coupled to the output.

A station is filtered from a received frequency band. Ceramic filters are used for this purpose. Frequently, also a plurality of ceramic filters in a series with inter-arranged amplifier stages is connected in series. Ceramic filters have the drawback that they have stray values of their characteristic data. Moreover, the use of ceramic filters evokes a low-pass effect which limits the frequency band of the stereo signal in a non-uniform manner. The transmission errors caused by the selectivity are compensated by means of an adjustable high-pass filter for higher frequency components. After decoding of the signal in the stereo decoder, these transmission errors lead to an asymmetrical or poor crosstalk of the two audio channels. The existing circuits have the drawback that external potentiometers are used for the adjustable high-pass filters so that an extra adjustment must be performed for each circuit or for each apparatus. External potentiometers are not resistant to ageing so that there is a constant change of the transfer function. Hitherto, the integration of large capacitances has not been realized. Ground as reference potential is a drawback because the system ground is beset with disturbances. Moreover, the value of such a reference potential cannot be changed.

SUMMARY OF THE INVENTION

It is therefore an object of the invention to provide a circuit arrangement for correcting the transmission errors caused by the selectivity without degrading the quality of the signal, this circuit arrangement being integrable.

According to the invention, this object is achieved by means of a circuit arrangement of the type described in the opening paragraph, in which non-inverting inputs of the first amplifier stage are connected to connections between resistors of the voltage divider unit, and a non-inverting input is selectable via a selection unit, and the voltage divider unit and the second resistor are connected to an adjustable, low-noise reference potential.

The transmission errors caused by ceramic filters are compensated by means of an adjustable high-pass filter. The input signal to be filtered with an impressed low-pass characteristic is applied via a second amplifier stage connected to the input of the circuit arrangement. Before this signal is applied to the stereo decoder stage, it is applied via this adjustable high-pass filter. This high-pass filter principally comprises a first resistor which is arranged in parallel with a variable capacitor, and a second resistor. The signal is divided into a main current and a sub-current. The main current is conveyed via the first resistor and the sub-current is conveyed via the variable capacitor. Both currents are added at a sum node at the output of the high-pass filter. The second resistor, which simultaneously constitutes the connection with a reference potential, is connected to this sum node. The variable capacitor is constituted by a voltage divider unit, a first amplifier stage and a capacitor connected to a voltage which is variable by means of the amplifier stage. The non-inverting inputs of the first amplifier stage are connected to different partial voltages of the preceding voltage divider units. The various non-inverting inputs of the amplifier stage are selected via a selection unit. The combined inverting inputs are negatively fed back to the output of the amplifier stage. When a non-inverting input of the first amplifier stage connected to a connection between two resistors at the voltage divider is selected via the selection unit, the voltage at the output of the first amplifier stage changes so that also the sub-current changes which is added to the main current at the sum node.

The reference potential to which the second resistor and the voltage divider unit are connected, is adjustable and has a low noise. It is formed from an external reference voltage which is applied to a third amplifier stage. By changing the external reference voltage, which is not beset with interference signals, the reference potential can be adapted to circuit-technical details.

The selection unit, which is preferably realized as an $I^2C$ bus, selects the non-inverting inputs at the first amplifier stage. Consequently, a partial voltage from the preceding voltage divider unit is present as an input signal for this first amplifier stage. The first amplifier stage has several inverting and non-inverting inputs. Current source transistors, as in EP 0 091 160 (FIG. 7), activating the input transistor pairs of the relevant non-inverting inputs, are driven via the selection unit.

The voltage divider unit comprises several resistors which are arranged linearly or non-linearly. With this arrangement, a corresponding number of different transfer functions of the high-pass filter is realized. The number of switchable partial voltages defines the number of high-pass filter transfer functions which can be realized.

The second amplifier stage is controlled at its non-inverting input by means of an input signal. This input signal comprises frequency components of the received frequency band and is limited in its higher frequencies by the low-pass characteristic of ceramic filters.

The amplified input signal is divided into a main current and a sub-current at the output of the second amplifier stage. The output of the second amplifier stage is fed back to the non-inverting input. The external reference voltage is applied to the inverting input of the second amplifier stage.

Due to this integrable high-pass filter, the signal at the sum node can be corrected in amplitude and phase. Only the sub-current is influenced by the amplifier stage and the capacitor. By selecting a corresponding partial voltage at the voltage divider unit, the voltage which is present at the capacitor, can be changed stepwise. This is to be equated with a variation of the capacitance. An adjustable high-pass filter is thus realized, whose transfer function can be adapted to requirements. Transmission errors can be eliminated by influencing the amplitude and phase at the sum node. No DC offset is transmitted via the capacitor because the DC working point of the sub-current is produced at this sum node.

These and other aspects of the invention are apparent from and will be elucidated with reference to the embodiments described hereinafter.

DESCRIPTION OF THE PREFERRED EMBODIMENT

Figure 1:
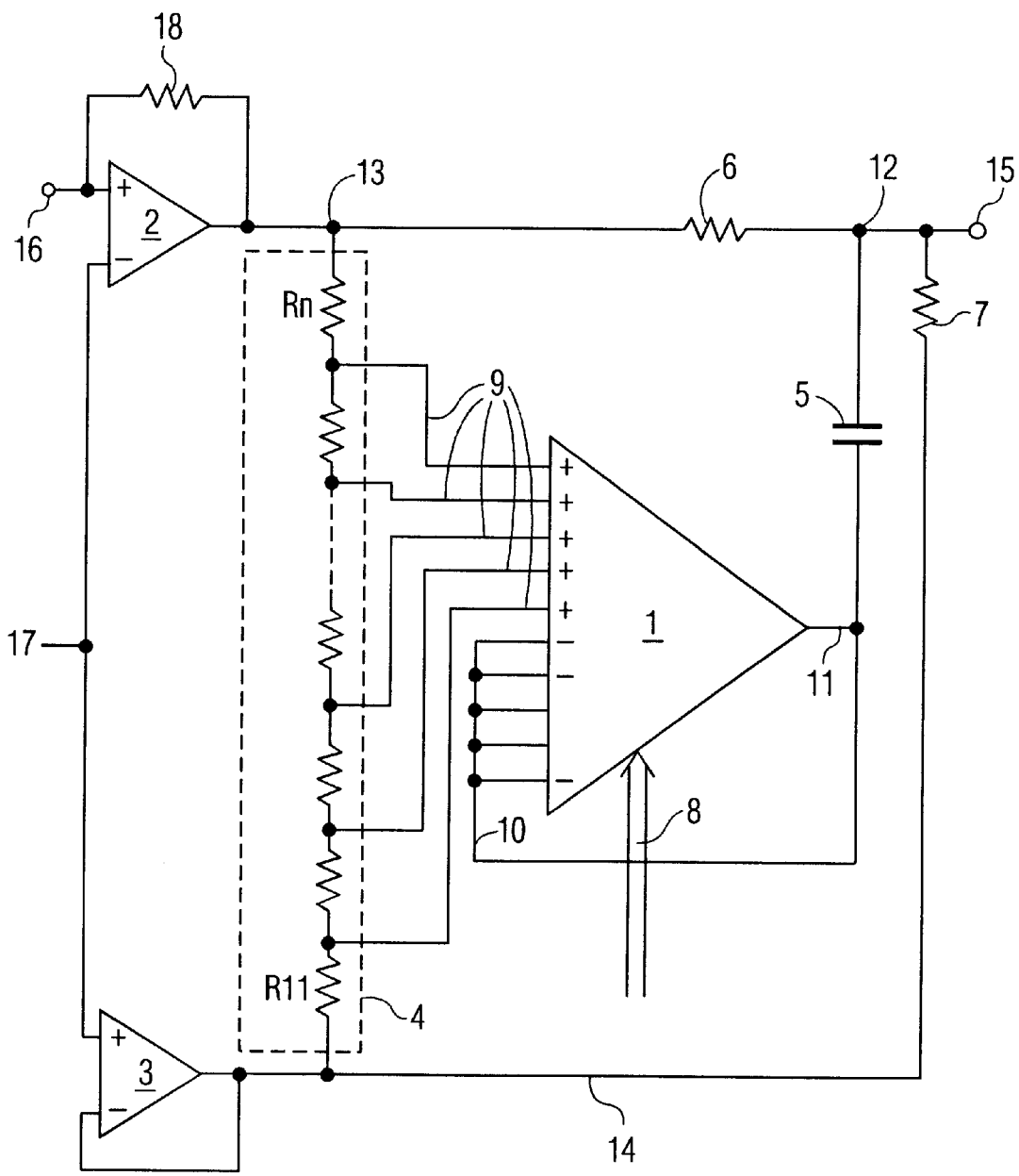
FIG. 1 shows a circuit arrangement for an adjustable high-pass filter.

The Figure shows three amplifier stages 1, 2 and 3, a voltage divider unit 4, a capacitor 5, resistors 6, 7 and 18, a selection unit bus 8, non-inverting inputs 9, inverting inputs 10 and the output signal 11 of the amplifier stage 1.

The amplifier stages 1, 2 and 3 are implemented as operational amplifiers. The operational amplifier 2 at the input 16 of the circuit arrangement amplifies the signal coming from ceramic filters with a gain factor k. This amplified input signal is divided into a main current and a sub-current at point 13.

The sub-current is applied to a non-inverting input via a voltage divider unit 4 consisting of resistors $R_{11}$ to $R_n$. The junction points between the separate resistors $R_{11}$ to $R_n$ are connected to non-inverting inputs 9 of the operational amplifier 1. The inverting inputs 10 are interconnected and connected to the output 11 of the operational amplifier 1. The capacitor 5 is connected to this output 11. The sub-current is applied to the sum node 12 via the capacitor 5. The sum node 12 simultaneously represents the output 15 of the high-pass filter. A high-impedance resistor 6, via which the main current is conveyed, is arranged between the point 13 and the sum node 12. A further high-impedance resistor 7 is connected to a common reference potential 14 via the sum node 12. This common reference potential 14 is constituted by the output of the operational amplifier 3.

The operational amplifier 1 is controlled via the selection unit bus 8 implemented as an I²C bus in such a way that one of the non-inverting inputs 9 is selected and the resultant partial voltage produced at the voltage divider unit 4 represents the input voltage for the operational amplifier 1. A differential amplifier (not shown) is associated with each non-inverting input. These differential amplifiers associated with the relevant non-inverting input are activated via a transistor arranged as a current source. Due to the differently selectable partial voltages, a variable current, which is dependent on these partial voltages, is produced at the output 11 of the operational amplifier 1, this variable current being applied to the sum node 12 via the capacitor 5. The main current, which is applied from the output of the operational amplifier 2 via the resistor 6 to the sum node 12, is characterized by a low-pass pass characteristic. Due to the arrangement of the capacitor 5, the operational amplifier 1 and the voltage divider unit 4, it is achieved that the sub-current is controllable in amplitude and also in phase so that the output signal 15 of the high-pass filter, which is applied to a stereo decoder, is formed as a resultant signal from the main current and the sub-current, and the main current with the low-pass characteristic and the transmission errors is corrected by the amplitude and phase-corrected signal of the sub-current. Due to the stepwise variable current through the capacitor 5, a result is achieved which equals a variation of the capacitance of the capacitor 5, so that an adjustable high-pass filter can be realized in its overall function. Due to the control of the partial voltage at the non-inverting inputs 9 of the operational amplifier 1 via the selection unit bus 8, a desired filter characteristic for this high-pass filter can thus be adjusted, so that the signal arriving at the input 16 with its transmission errors can be corrected in phase and amplitude and, consequently, the transmission errors in the stereo decoder cannot lead to a non-uniform crosstalk between the right and left channel.

An adjustable low-noise reference potential is created with the third operational amplifier 3. The non-inverting input of the operational amplifier 3 is connected to an external reference voltage 17. This reference voltage 17 is approximately 3.7 V, i.e., between the operating voltage and ground. The output of the operational amplifier 3 is coupled to its inverting input. The reference potential 14 present at the output of the operational amplifier 3 can be shifted in positive and negative directions by changing the external reference voltage 17. The voltage divider unit 4 and the second resistor 7 are connected to this reference potential 14. In this way, a reference signal is produced which is free from interference and on which no signals are transmitted. This external reference voltage 17 is supplied to the inverting input of the operational amplifier 2.

The voltage divider unit 4 may have a linear division. Based on this division, the corresponding transfer functions of the high-pass filter are realized. The range in which the transfer functions of the high-pass filter can be changed is fixed by choosing the value of the capacitance to be integrated of the capacitor 5.

Figure 2:
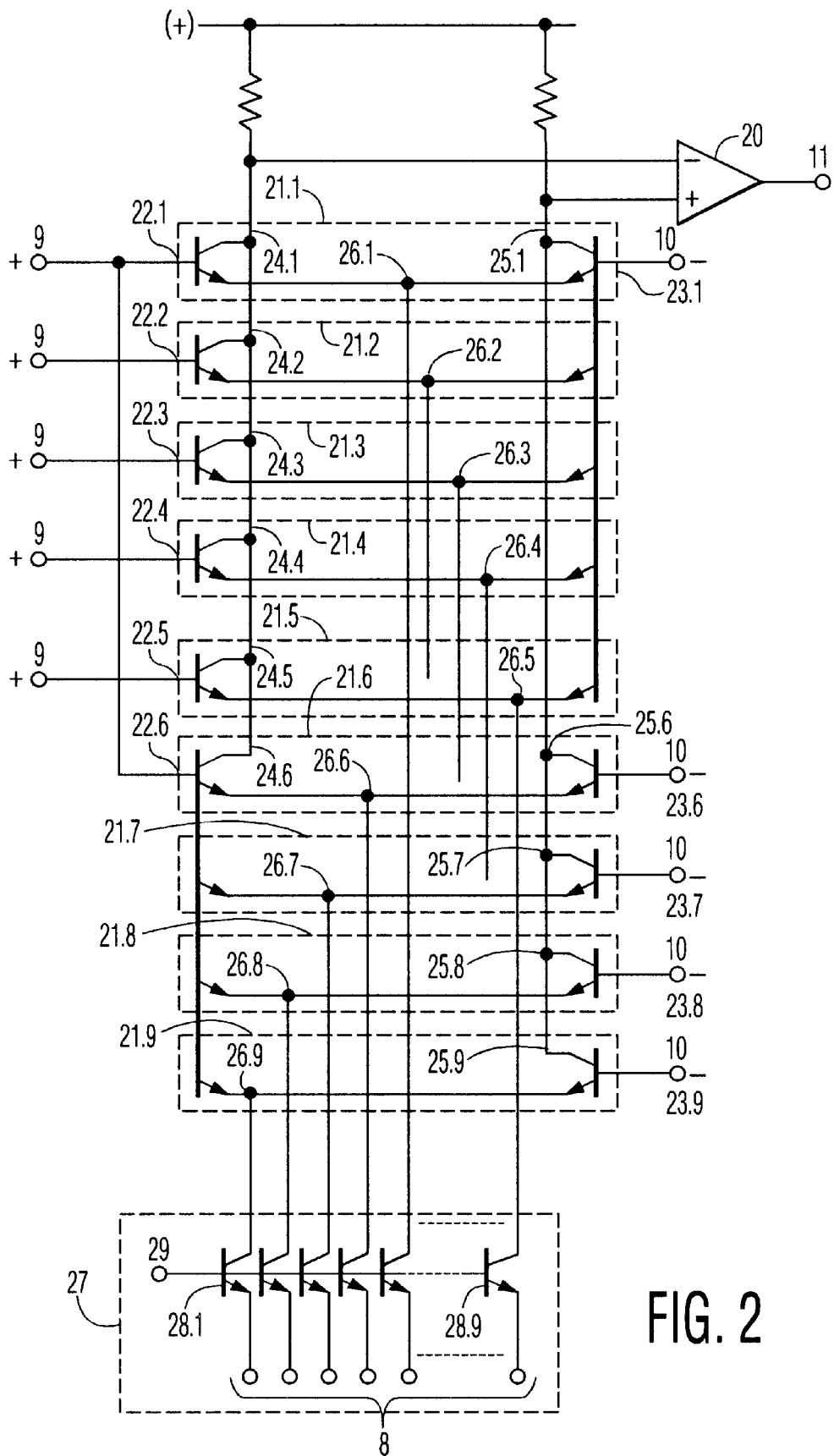
FIG. 2 shows a schematic block diagram of an embodiment of the operational amplifier in the adjustable high-pass filter in FIG. 1.

FIG. 2 shows an embodiment of the operational amplifier 1 adapted from FIG. 7 of EP 0091160. The operational amplifier 1 includes a plurality of differential amplifiers, the number of differential amplifiers corresponding to the sum of the number of inputs to the operational amplifier 1, minus 1, or 9 in the case of operational amplifier 1. The differential amplifier are designated 21.1 to 21.9 in FIG. 2. Each differential amplifier (such as 21.i, i varying from 1 to 9) has first and second inputs (22.i and 23.i, respectively) for receiving a differential signal, first and second outputs (24.i and 25.i, respectively) for supplying two output signals which are in phase opposition and which depend on the differential signal, and a control input (26.i) for receiving a control signal. The first inputs of five of the differential amplifiers, namely, the inputs 22.1 to 22.5 of the differential amplifiers 21.1 to 21.5 are each coupled to a respective non-inverting (+) input of the operational amplifier 1. The first inputs of the other differential amplifiers 21.6 to 21.9 are all coupled to the input 22.1 of the differential amplifier 21.1.

The second inputs of the five differential amplifiers 21.1 to 21.5 are all coupled to a first inverting (−) input 10 of the operational amplifier 1. The second inputs of the other differential amplifiers, namely the inputs 23.6 to 23.9 of the differential amplifiers 21.6 to 21.9, respectively, are each coupled to a respective one of the remaining inverting (−) inputs 10 of the operational amplifier 1. The first outputs 24.1, 24.2, . . . , etc., of all of the differential amplifiers 21.i are coupled to the inverting (−) input of an amplifier stage 20, and the second outputs 25.1, 25.2, . . . , etc., of all of the differential amplifiers 21.i are coupled to the non-inverting (+) input of the amplifier stage 20, the output of this amplifier stage 20 forming the output of the operational amplifier 1. Further, a selection unit 27 selectively energizes individual ones of the differential amplifiers 21.i. This selection unit 27 is coupled to the control inputs 26.1, 26.2, . . . , etc., of all of the differential amplifiers 21.i. Each differential amplifier 21.i comprises two transistors, having bases connected to the first input and to the second input, respectively, collectors connected to the first output and to the second output, respectively, and emitter both connected to the control input of the differential amplifier. The selection unit 27 comprises a plurality of transistors 28.1 to 28.9, having bases all connected to a point of constant potential 29 and collectors each connected to a control input of an associated differential amplifier. The emitters of all of the transistors but one receive a high voltage, so that they are all turned off. The remaining transistor receives a low voltage, so that it is turned on. The associated differential amplifier 21.i is then selected, that is, only the signals on the first and second inputs of this differential amplifier 21.i are transferred to the inputs of amplifier stage 20 by the combined switching unit. By consecutively applying a low voltage to the emitters of the transistors 28.1, 28.2, . . . , 28.9, it is possible to select one of the non-inverting (+) inputs 9 and any one of the inverting (−) inputs 10 of the operational amplifier 1, or to select one of the inverting (−) inputs 10 and any one of the non-inverting (+) inputs 9 of the operational amplifier 1. The emitters of the transistors 28.1 to 28.9 receive I$^2$C signals on the selection unit bus 8.

Figure 3:
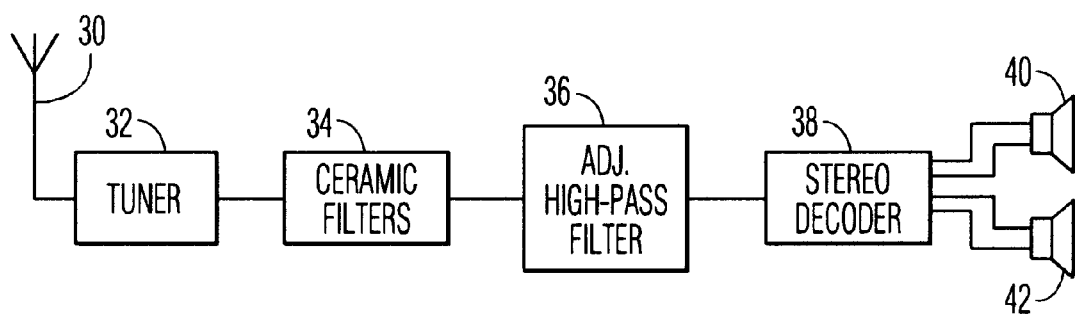
FIG. 3 shows a block diagram of a receiver using the adjustable high-pass filter of the subject invention.

FIG. 3 shows a block diagram of a radio receiver having the adjustable high-pass filter of the subject invention incorporated therein. In particular, the radio receiver includes an antenna 30 for receiving radio signals. A tuner 32 selectively tunes the radio receiver to one of the radio signals. Ceramic filters 34 are used for filtering the received frequency band. The adjustable high-pass filter 36 of the subject invention is coupled to the output of the ceramic filters 34. The output from the adjustable high-pass filter 36 is coupled to an input of a stereo decoder 38 which applies audio signals to loudspeakers 40 and 42.

What is claimed is:

1. An adjustable high-pass filter comprising:

an input for receiving an input signal to be filtered;

a main path coupled to said input for conveying a main current, said main path including a first resistor, and an output connected to a sum node, said sum node forming an output of said adjustable high-pass filter;

a sub-path also coupled to said input for conveying a sub-current, said sub-path comprising a voltage divider unit having a series arrangement of a plurality of resistors, a first amplifier stage having non-inverting inputs coupled to connections between the resistors of said voltage divider unit, and inverting inputs coupled to an output the first amplifier stage, said first amplifier stage including a selection unit for selecting one of said non-inverting inputs, and a capacitor coupling the output of the first amplifier stage to the sum node;

a second resistor connected to the sum node; and means for providing a variable, low noise reference potential, said voltage divider unit and said second resistor being coupled to said reference potential providing means, wherein the main current and the sub-current are added at the sum node.

2. The adjustable high-pass filter as claimed in claim 1, wherein the first amplifier stage includes a selection unit bus for providing control signals to said selection unit, said selection unit bus being an I$^2$C bus.

3. The adjustable high-pass filter as claimed in claim 2, wherein first amplifier stage comprises input transistor pairs at each of the non-inverting inputs, said input transistor pairs being selectable by the selection unit via current source transistors.

4. The adjustable high-pass filter as claimed in claim 1, wherein the voltage divider unit has a non-linear division.

5. The adjustable high-pass filter as claimed in claim 1, wherein said adjustable high-pass filter further comprises a second amplifier stage having a non-inverting input coupled to the input of the adjustable high-pass filter for receiving the input signal, an inverting input and an output, the output of said second amplifier stage being coupled to both said main path and said sub-path, an output signal from the output of the second amplifier stage being negatively fed back to the non-inverting input, and the inverting input being controlled by an external reference voltage between an operating voltage and ground.

6. The adjustable high-pass filter as claimed in claim 5, wherein the reference potential providing means comprises a third amplifier stage having a non-inverting input coupled to receive said reference voltage, an inverting input, and an output for supplying the reference potential, the output being negatively fed back to the inverting input.

7. A radio receiver having ceramic filters for filtering a received frequency band, and a stereo decoder for providing left and right audio channel signals, wherein said radio receiver further comprises an adjustable high-pass filter coupled between said ceramic filters and said stereo decoder, said adjustable high-pass filter comprising:

an input for receiving an input signal to be filtered;

a main path coupled to said input for conveying a main current, said main path including a first resistor, and an output connected to a sum node, said sum node forming an output of said adjustable high-pass filter;

a sub-path also coupled to said input for conveying a sub-current, said sub-path comprising a voltage divider unit having a series arrangement of a plurality of resistors, a first amplifier stage having non-inverting inputs coupled to connections between the resistors of said voltage divider unit, and inverting inputs coupled to an output the first amplifier stage, said first amplifier stage including a selection unit for selecting one of said non-inverting inputs, and a capacitor coupling the output of the first amplifier stage to the sum node;

a second resistor connected to the sum node; and means for providing a variable, low noise reference potential, said voltage divider unit and said second resistor being coupled to said reference potential providing means, wherein the main current in the main path and the sub-current in the sub-path are added at the sum node.

\* \* \* \* \*